(12) United States Patent
Zhang et al.

(10) Patent No.: US 9,245,661 B2
(45) Date of Patent: Jan. 26, 2016

(54) CONDUCTIVE FILM WITH DOPED LAYERS, METHOD FOR PRODUCING THE SAME, AND ARRAY SUBSTRATE COMPRISING THE SAME

(71) Applicant: BOE TECHNOLOGY GROUP CO., LTD., Beijing (CN)

(72) Inventors: Bin Zhang, Beijing (CN); Zhengliang Li, Beijing (CN); Zhen Liu, Beijing (CN); Luke Ding, Beijing (CN); Zhanfeng Cao, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/313,502

(22) Filed: Jun. 24, 2014

(65) Prior Publication Data

US 2015/0243399 A1    Aug. 27, 2015

(30) Foreign Application Priority Data

Feb. 26, 2014  (CN) .......................... 2014 1 0067432

(51) Int. Cl.
  *H01L 27/14* (2006.01)
  *H01B 1/02* (2006.01)
  *B32B 15/01* (2006.01)
  *H01L 27/12* (2006.01)
  *H01L 21/285* (2006.01)

(52) U.S. Cl.
  CPC ........ *H01B 1/02* (2013.01); *B32B 15/01* (2013.01); *H01L 21/28506* (2013.01); *H01L 27/124* (2013.01); *H01L 27/1262* (2013.01)

(58) Field of Classification Search
  CPC .... H01B 1/02; B32B 15/01; H01L 21/28506; H01L 27/124; H01L 27/1262

USPC ............................................................ 257/72
See application file for complete search history.

(56) References Cited

U.S. PATENT DOCUMENTS

| | | | | | |
|---|---|---|---|---|---|
| 6,069,068 | A | * | 5/2000 | Rathore | H01L 21/76846 257/E21.585 |
| 6,130,161 | A | * | 10/2000 | Ashley | H01L 21/76846 257/751 |
| 6,780,342 | B1 | * | 8/2004 | Hagihara | H01L 21/31116 216/67 |
| 8,916,973 | B1 | * | 12/2014 | Kim | H01L 23/345 257/750 |
| 2002/0130046 | A1 | * | 9/2002 | Cheung | C25D 3/38 205/104 |
| 2002/0130419 | A1 | * | 9/2002 | Ahn | H01L 21/2855 257/762 |

(Continued)

FOREIGN PATENT DOCUMENTS

| | | |
|---|---|---|
| CN | 1343006 A | 4/2002 |
| CN | 101246875 A | 8/2008 |
| CN | 101512730 A | 8/2009 |

OTHER PUBLICATIONS

English translation of Chinese Office Action dated Oct. 16, 2015, for corresponding Chinese Patent Application No. 201410067432.4.

*Primary Examiner* — Caleb Henry
(74) *Attorney, Agent, or Firm* — Kinney & Lange, P.A.

(57) ABSTRACT

A conductive film, a method for producing the same and an array substrate comprising the same are provided, so that copper atoms can be efficiently prevented from diffusing into an adjacent semiconductor layer or interlaminated insulation film. The conductive film comprises a base film made of copper or copper alloy, in which hydrogen and/or carbon atoms are distributed.

10 Claims, 1 Drawing Sheet

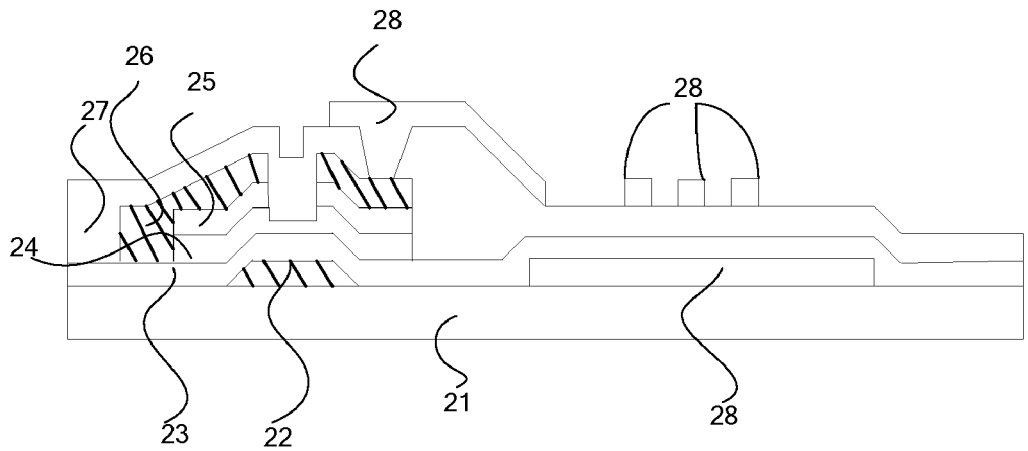

(56) References Cited

U.S. PATENT DOCUMENTS

| | | |
|---|---|---|
| 2003/0137050 A1 | 7/2003 | Chambers et al. |
| 2006/0105570 A1 | 5/2006 | Hautala et al. |
| 2006/0121709 A1* | 6/2006 | Doppelt .................. C07F 1/00 438/584 |
| 2009/0104775 A1* | 4/2009 | Gonohe .................. C23C 16/34 438/680 |
| 2009/0114874 A1* | 5/2009 | Norman ................ C07F 7/1844 252/62.3 E |
| 2014/0326700 A1* | 11/2014 | Bouchiat ............. C01B 31/0453 216/37 |
| 2015/0021775 A1* | 1/2015 | Matsumoto ....... H01L 21/02142 257/751 |
| 2015/0121837 A1* | 5/2015 | Kinloch .................. C23C 16/26 59/88 |

* cited by examiner providing a copper or copper alloy target fixing the above target in a vacuum chamber of a magnetron sputtering film plating apparatus, putting a substrate into the vacuum chamber, and evacuating the vacuum chamber introducing a working gas and a sputtering regulation gas into the vacuum chamber, regulating a temperature and a partial pressure of the sputtering regulation gas in deposition, and performing a film deposition on a substrate by a sputtering deposition process so as to prepare a conductive film

Fig. 1

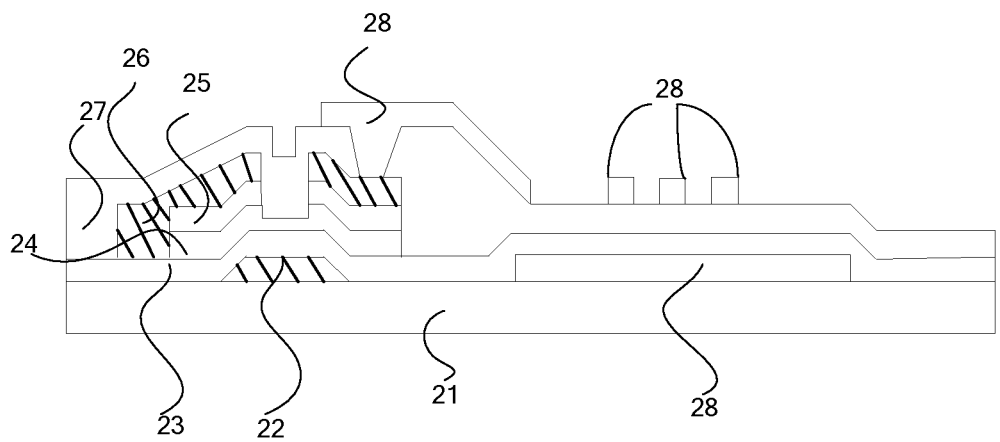

Fig. 2

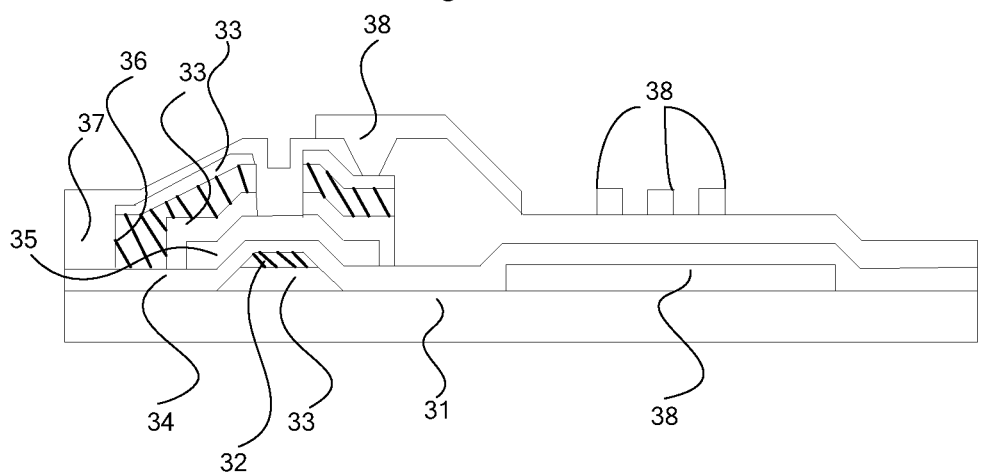

Fig. 3

CONDUCTIVE FILM WITH DOPED LAYERS, METHOD FOR PRODUCING THE SAME, AND ARRAY SUBSTRATE COMPRISING THE SAME

CROSS-REFERENCE TO RELATED APPLICATION

This application claims the benefit of Chinese Patent Application No. 201410067432.4 filed on Feb. 26, 2014 in the State Intellectual Property Office of China, the whole disclosure of which is incorporated herein by reference.

BACKGROUND OF THE INVENTION

1. Field of the Invention

The present disclosure generally relates to a technical field of conductive connection of semiconductor devices, more particularly, relates to a conductive film, a method for producing the conductive film and an array substrate comprising the conductive film.

2. Description of the Related Art

Recently, most of metal wiring films for electronic elements in semiconductor IC or transistors of a FPD (flat panel display) are formed by low resistance materials, such as aluminum or copper. For example, in the thin film transistor display, the requirements to the low resistances of wiring electrodes are being increased due to a development of a large sized panel. Thus, use of aluminum or copper as low resistance wirings becomes more and more necessary.

As copper has a lower resistance than aluminum, is easily oxidized and can avoid the problem that aluminum may degrade the contact resistance with transparent electrodes composed of ITO, at present, most of low resistance wirings films are formed by copper. However, in comparison with other wirings materials, copper may cause a problem that it is easy to diffuse into silicon semiconductors or oxide semiconductor when it is used to form a source/drain electrode. In particular, when copper contacts with an interlayer or inter-laminated insulation film composed of oxide semiconductors or oxides, copper atoms tend to diffuse into the oxides.

SUMMARY OF THE INVENTION

The present invention has been made to overcome or alleviate at least one of the above mentioned problems.

Embodiments of the present invention provide a conductive film, a method for producing the conductive film and an array substrate comprising the conductive film, for example, in order to prevent efficiently copper atoms from diffusing into adjacent structures such as semiconductor layers or inter-laminated insulation films.

According to an aspect of the present disclosure, there is provided a conductive film, comprising a base film, which is made of copper or copper alloy and in which hydrogen and/or carbon atoms are distributed.

According to another aspect of the present disclosure, there is provided an array substrate comprising a plurality of metal layers, wherein at least one of the plurality of metal layers is the conductive film as described above or a combined film formed by the conductive film as described above and a copper film.

According to a further aspect of the present disclosure, there is provided a method for producing the conductive film as described above, comprising:

providing a copper or copper alloy target;

fixing the above target in a vacuum chamber of a magnetron sputtering film plating apparatus, putting a substrate into the vacuum chamber, and evacuating the vacuum chamber;

introducing a working gas and a sputtering regulation gas which is not reactive to the target into the vacuum chamber, the working gas being adapted to collide with electrons to form high-energy ions to bombard the target such that the target is caused to sputter, the sputtering regulation gas being adapted to generate the hydrogen and/or carbon atoms in collision; and performing a film deposition on the substrate by sputtering of the target to form a copper or copper alloy base film, wherein the resultant hydrogen or carbon atoms permeate into the base film during the deposition to form the conductive film.

BRIEF DESCRIPTION OF THE DRAWINGS

The above and other features of the present invention will become more apparent by describing in detail exemplary embodiments thereof with reference to the accompanying drawings, in which:

FIG. 1 is an illustrative flow chart of a method for producing a conductive film according to an exemplary embodiment of the present invention;

FIG. 2 is a schematic view of a FFS type array substrate including the conductive film produced by the above method according to an embodiment of the present invention; and FIG. 3 is a schematic view of another FFS type array substrate including the conductive film produced by the above method according to another embodiment of the present invention.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The conductive film, the method for producing the conductive film and the array substrate comprising the conductive film provided in embodiments of the present invention will be further described below with reference to drawings.

According to a general invention concept, there is provided a conductive film, comprising a base film, which is made of copper or copper alloy and in which hydrogen and/or carbon atoms are distributed.

In an exemplary embodiment of the present invention, a magnetron sputtering method is used. In this method, hydrogen or carbon atoms may permeate by sputtering into a copper or copper alloy base film by adjusting working parameters of gases used in the sputtering deposition process. The magnetron sputtering method is a method in which electrons collide with argon atoms with actions of electrical field during flying to a substrate to ionize the argon atoms into argon ions and new electrons. The new electrons fly to the substrate, while the argon ions are speeded up by the electrical field to fly toward cathode target and to bombard the surface of the target with high energy to cause the target to sputter, so that neutron target atoms or molecules are deposited on the substrate in the process of sputtering particles so as to form a film.

Different from conventional conductive films, the conductive film according to embodiments of the present invention is permeated with hydrogen and/or carbon atoms by a sputtering deposition process. After the hydrogen and/or carbon atoms permeate into a copper or copper alloy base film by the sputtering deposition process, defects may be formed in the base film by the hydrogen and/or carbon atoms, so that the copper atoms around the defects can be bound by these defects, and thus are efficiently prevented from diffusing into other structures of a semiconductor device, for example, semiconductor layers or interlaminated insulation films. As such, an adhesive force of the conductive film can be increased and the stability of the conductive film can be improved.

In order to form the defects in the conductive film in the sputtering deposition process so as to bind the copper atoms in the film to prevent the copper atoms from diffusing into semiconductor materials, it needs that atoms with small atom radius can be produced through collision and bombardments in the sputtering deposition process so that they may permeate into the copper or copper alloy base film in a better fashion. In an exemplary embodiment, in consideration of the size of the atom radius of the atoms produced in the sputtering deposition process, hydrogen and/or carbon elements are used to generate the atoms which will permeate into the copper or copper alloy base film instead of other non-metal elements. It should be noted that the elements listed in the present embodiment are only preferred among inorganic non-metal elements. The skilled person in the art may select suitable elements as required as long as the atoms with small atom radius may be acquired by collision and bombardment and may permeate into the base films in a better fashion. After the atoms with small atom radius permeate into the base film, one part of the atoms take part in constructing crystal lattices of copper to replace some copper atoms to form doped defects; other part of the atoms are present in free state and bind copper atoms by other forces such as electrostatic forces to able to form defects of binding the copper atoms in the base film, instead of being combined to the copper atoms or other alloy elements by chemical bonding.

In the embodiment, copper or copper alloy is selected as a material of the target mainly because copper has a low resistance and a good conductive performance and meet the requirement for hardness of the targets. Preferably, the copper alloy may comprise one or more of the following compositions: manganese, aluminum, magnesium, calcium, zinc, titanium, zirconium, hafnium, vanadium, niobium, tantalum, chromium, molybdenum, tungsten, iron, ruthenium, osmium, cobalt, bismuth, silver, tin, boron, silicon, lanthanum, cerium, praseodymium and neodymium. It should be noted that alloy compositions of the copper alloy may any combination of above compositions. Preferably, copper, copper-molybdenum alloy, copper-manganese alloy, copper-magnesium alloy or other copper alloys may be used.

In the conductive film according to the embodiment, preferably, the conductive film contains copper having a proportion between 75 atom % and 100 atom % (i.e., atom percent) therein, more preferably, the proportion of copper in the conductive film is between 80 atom % and 95 atom %, in order to improve the mechanical performance of the conductive film while not degrading conductivity of the conductive film.

Another exemplary embodiment of the present invention also provides an array substrate comprising a plurality of metal layers, at least one of the plurality of metal layers is the conductive film as described above or a combined film formed by the conductive film as described above and a copper film.

Alternatively, in an aspect of the embodiment, the conductive film according to the embodiment of the present invention may be used as metal layers such as gate electrodes, source/drain electrodes and/or pixel electrodes, in the array substrate or semiconductor devices. It should be noted that the metal layer may be a single layer of the conductive film, or may be formed by sequential deposition of the conductive film and a copper film, i.e., is a combined film at least comprising a layer of the above conductive film, a copper film or layer and another layer of the conductive film laminated in sequence. When the combined film is used as a metal layer, such as gate electrodes, source/drain electrodes and/or pixel electrode, the conductive film may prevent copper atoms in the intermediate copper film from diffusing into semiconductor silicon layer of interlaminated insulation film in two directions in a better way and may further improve the conductive performance of copper. It should be noted that in the array substrate or semiconductor devices, not only gate electrodes, source/drain electrodes and/or pixel electrodes may be composed of the conductive film provided by embodiments of the present invention, but also other metal layers such as interconnected wirings layers may be formed by the above conductive film, that is, use of the conductive film may be selected by the skilled person in the art as required.

An exemplary embodiment of the present invention provides an array substrate in which at least one metal layers may be formed by the conductive film according to the embodiments of the present invention. The conductive film according to the embodiments of the present invention is permeated with hydrogen and/or carbon atoms by a sputtering deposition process, and the hydrogen and/or carbon atoms may form defects in the copper or copper alloy base film after they permeate into the base film. By means of binding the copper atoms around the defects by the defects, the copper atoms may be prevented efficiently from diffusing to other structures, for example, the semiconductor layers or interlaminated insulation film, so as to increase adhesive force of the conductive film. When the conductive film is used in the respective metal layers, the stability of the array substrate may be further improved.

FIG. 1 is an illustrative flow chart of a method for producing a conductive film according to an exemplary embodiment of the present invention. As illustrated in FIG. 1, the method mainly comprises:

providing a copper or copper alloy target;

fixing the target in a vacuum chamber of a magnetron sputtering film plating apparatus, putting a substrate into the vacuum chamber, and evacuating the vacuum chamber;

introducing a working gas and a sputtering regulation gas which is not reactive to the target into the vacuum chamber, the working gas being adapted to collide with electrons to form high-energy ions to bombard the target such that the target is caused to sputter, the sputtering regulation gas being adapted to generate hydrogen and/or carbon atoms in collision; and performing a film deposition on the substrate by sputtering of the target to form a copper or copper alloy base film, wherein the resultant hydrogen or carbon atoms permeate into the base film during the deposition to form the conductive film.

In the embodiment, the working gas and the sputtering regulation gas may be introduced into the vacuum chamber together, and during the sputtering deposition process, the working gas will collide with electrons to form high-energy ions to bombard the target such that the target is caused to sputter, the sputtering regulation gas will generate the atoms with small atom radius in collision. The atoms with small atom radius permeate into the base film formed by sputtering of the target so as to form defects in base film, so that the copper atoms in the base film may be bound by the defects and thus be prevented from diffusing into the semiconductor material layer.

In an example, the working gas may be argon gas. A gas which is inactive to the target and may generate the atoms with small atom radius after collision or bombardment is preferably selected as the sputtering regulation gas. In an exemplary embodiment, preferably, the sputtering regulation gas may be hydrogen ($H_2$) or methane gas ($CH_4$).

In addition, a temperature and a partial pressure of the sputtering regulation gas in the sputtering deposition process may be regulated such that the hydrogen or carbon atoms form defects for binding copper atoms in the base film. In a preferred aspect, the partial pressure of the sputtering regulation gas in the sputtering deposition process may be regulated to be 1%~30% of a total pressure in the vacuum chamber. When the partial pressure of the sputtering regulation gas is regulated in the above range, it may ensure that the defects may be formed sufficiently in the resultant conductive film such that the copper atoms in the conductive film may be bound in a better way. If the ratio of the partial pressure of the sputtering regulation gas in the sputtering deposition process to total pressure in the vacuum chamber is less than 1%, the hydrogen or carbon atoms will not permeate into the conductive film. If the ratio is greater than 30%, the effects of the working gas in the magnetron sputtering process will be influenced. Preferably, the ratio of the partial pressure of the sputtering regulation gas in the sputtering deposition process to total pressure in the vacuum chamber is 5%~15%. In this range, the two issues may be compromised well.

In the sputtering deposition process, the energy of electrons will be depleted as the times of collision increases. At that time, as the electrons have low energy, the energy transferred by them to the substrate is also small so as to cause a relative low temperature of the substrate. In order to ensure the sputtering deposition process to be performed successfully, preferably, the sputtering regulation gas has a temperature of 0° C.-800° C., that is, is introduced in the vacuum chamber in a temperature of 0° C.~800° C., in sputtering deposition process. More preferably, the temperature may be 25° C.~250° C. It should be noted that the temperature may be regulated depending on different magnetron sputtering processes to keep the reaction to perform at relative low reactive temperature, which may achieve a more uniform film formed by sputtering. Further, damage to the elements with a low heat resistance or thermal bearing capacity may be avoided in such a temperature.

An exemplary embodiment of the present invention provides a method for producing a conductive film. By means of the method, the hydrogen and/or carbon atoms may permeate in the conductive film. After the hydrogen or carbon atoms permeate into the copper and copper alloy base film by a sputtering deposition process, there may be defects formed in the base film. The defects may bind the copper atoms around the defects, which may efficiently prevent the copper atoms from diffusing into the semiconductor layer and further may increase the adhesive forces of the conductive film to improve stability of the array substrate. The method is easy to operate and has a good applicability and thus may be applied widely in the manufacturing of array substrate or semiconductor device.

In order to explain the conductive film, the method for producing the conductive film and the array substrate comprising the conductive film provided by embodiments of the present invention, some specific examples will be explained below. Examples 1-2 explains two specific examples in which the conductive film provided by an embodiment of the present invention is applied in an FFS (fringe field switching) type array substrate. However, it should be understood that the conductive film provided by an embodiment of the present invention may also be applied in a TN, VA, IPS, ADS or OLED type array substrate and the associated metal electrode field. It should be noted that in each of the above examples, an active layer produced from both the amorphous silicon and the doped amorphous silicon may be replaced by a oxide semiconductor active layer.

Example 1

As illustrated in FIG. 2, a gate layer 22 (a hydrogen/carbon permeated copper or copper alloy layer) is deposited on a substrate 21 by a magnetron sputtering deposition process. A gate layer pattern comprising gate electrodes is formed by performing a patterning process one time. A gate insulation layer 23 and an active layer (comprising an amorphous silicon layer 24 and a doped amorphous silicon layer 25) are deposited on the gate layer pattern by a chemical vapor deposition process. An active layer pattern is formed by performing another patterning process one time. A source/drain electrode layer 26 (a hydrogen/carbon permeated copper or copper alloy layer) is deposited on the active layer pattern by a magnetron sputtering deposition process. A source/drain electrode layer pattern comprising source electrodes and drain electrodes is formed by performing a further patterning process one time. Then, a passivation layer 27 is deposited by a chemical vapor deposition process. A passivation layer pattern comprising vias is formed by performing a further patterning process one time. Finally, a pixel electrode layer 28 (a hydrogen/carbon permeated copper or copper alloy layer) is deposited by a magnetron sputtering deposition process. A pixel electrode layer pattern comprising pixel electrodes is formed by performing a further patterning process one time. The pixel electrodes are connected to the drain electrodes by the vias. The gate electrode layer 22, the source/drain electrode layer 26 and/or the pixel electrode layer 28 are hydrogen/carbon permeated copper or copper alloy layers, which may be mainly made of copper, copper-molybdenum alloy, copper-manganese alloy, copper-magnesium alloy or other copper alloys. The hydrogen/carbon permeated copper or copper alloy layers are formed for example by a sputtering deposition process in an atmosphere of $H_2$. In this example, copper content in the electrode layer(s) is 80%, the partial pressure of $H_2$ is 5% and the temperature is 25° C. during deposition.

Example 2

As illustrated in FIG. 3, a hydrogen/carbon permeated copper or copper alloy layer 33 and a gate electrode layer (copper film layer) 32 are deposited on a substrate 31 by a magnetron sputtering deposition. A gate layer pattern comprising gate electrodes is formed by performing a patterning process one time. A gate insulation layer 34 and an oxide semiconductor layer 35 are deposited on the gate layer pattern by a chemical vapor deposition process. The oxide semiconductor layer 35 is formed by performing another patterning process one time. Then, on the substrate on which the above layers have been formed, a hydrogen/carbon permeated copper or copper alloy layer, a source/drain electrode layer 36 (copper film layer) and a hydrogen/carbon permeated copper or copper alloy layer are deposited in sequence by a magnetron sputtering deposition. A source/drain layer pattern comprising source electrodes and the drain electrodes is formed by performing a further patterning process one time. Then, a passivation layer 37 is deposited by a chemical vapor deposition process. A passivation layer pattern comprising vias is formed by performing a further patterning process one time. Finally, a pixel electrode layer 38 (hydrogen/carbon permeated copper or copper alloy layer) is deposited by a magnetron sputtering deposition process. A pixel electrode layer pattern comprising pixel electrodes is formed in by performing a further patterning process one time. The pixel electrodes are connected to the drain electrodes by the vias. In this example, hydrogen/carbon permeated copper or copper alloy layers are coated or formed above and below the gate electrode layer 32 and the source/drain electrode layer 36, thereby efficiently preventing the copper atoms in the copper or copper allow layers from diffusing into the semiconductor layer around it. The hydrogen/carbon permeated copper or copper alloy layers may be made of copper, copper-molybdenum alloy, copper-manganese alloy, copper-magnesium alloy or other copper alloys. The hydrogen/carbon permeated copper or copper alloy layers are formed for example by a sputtering deposition process in an atmosphere of $CH_4$. In this example, copper content in the electrode layer(s) is 85%, the partial pressure of $CH_4$ during deposition is 15%, and the temperature is 150° C.

Although several exemplary embodiments have been shown and described, the present invention is not limited to those and it would be appreciated by those skilled in the art that various changes or modifications may be made in these embodiments without departing from the principles and spirit of the disclosure, the scope of which is defined in the claims and their equivalents.

What is claimed is:

1. An array substrate comprising a plurality of metal layers, wherein at least one of the plurality of metal layers is a combined film formed by a first conductive film, a copper film, and a second conductive film laminated in sequence, each of the first and second conductive film comprising a base film which is made of copper or copper alloy and in which hydrogen and/or carbon atoms are distributed.

2. The array substrate according to claim 1, wherein the plurality of metal layers comprise one or more of gate electrodes, source/drain electrodes, pixel electrodes and an interconnected wiring layer.

3. A method for producing a conductive film, the conductive film comprising a base film which is made of copper or copper alloy and in which hydrogen and/or carbon atoms are distributed, the method comprising:

providing a copper or copper alloy target;

fixing the target in a vacuum chamber of a magnetron sputtering film plating apparatus, putting a substrate into the vacuum chamber, and evacuating the vacuum chamber;

introducing a working gas and a sputtering regulation gas which is not reactive to the target into the vacuum chamber, the working gas being adapted to collide with electrons to form high-energy ions to bombard the target such that the target is caused to sputter, and the sputtering regulation gas being adapted to generate the hydrogen and/or carbon atoms in collision; and performing a film deposition on the substrate by sputtering of the target to form a copper or copper alloy base film, wherein the generated hydrogen or carbon atoms permeate into the base film during the deposition to form the conductive film.

4. The method according to claim 3, wherein the sputtering regulation gas comprises hydrogen or methane gas.

5. The method according to claim 3, wherein a temperature and a partial pressure of the sputtering regulation gas are regulated during deposition such that the hydrogen or carbon atoms form defects for binding copper atoms in the base film.

6. The method according to claim 5, wherein a ratio of the partial pressure of the sputtering regulation gas during deposition to a total pressure in the vacuum chamber is 1%~30%.

7. The method according to claim 6, wherein the ratio is 5%~15%.

8. The method according to claim 5, wherein the temperature of the sputtering regulation gas is 0° C.~800° C. during deposition.

9. The method according to claim 8, wherein the temperature of the sputtering regulation gas is 25° C.~250° C. during deposition.

10. The method according to claim 3, wherein the working gas comprises argon gas.

* * * * *